(12) United States Patent
Lin et al.

(10) Patent No.: US 9,184,292 B2
(45) Date of Patent: Nov. 10, 2015

(54) SEMICONDUCTOR STRUCTURE WITH DIFFERENT FINS OF FINFETS

(71) Applicant: United Microelectronics Corp., Hsinchu (TW)

(72) Inventors: Chin-Fu Lin, Tainan (TW); Chin-Cheng Chien, Tainan (TW); Chun-Yuan Wu, Yunlin County (TW); Teng-Chun Tsai, Tainan (TW); Chih-Chien Liu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/340,267

(22) Filed: Jul. 24, 2014

(65) Prior Publication Data
US 2014/0332824 A1 Nov. 13, 2014

Related U.S. Application Data

(62) Division of application No. 13/370,231, filed on Feb. 9, 2012, now Pat. No. 8,822,284.

(51) Int. Cl.
| H01L 29/04 | (2006.01) |
| H01L 29/76 | (2006.01) |
| H01L 29/78 | (2006.01) |
| H01L 21/8234 | (2006.01) |
| H01L 27/108 | (2006.01) |
| H01L 29/66 | (2006.01) |
| H01L 21/764 | (2006.01) |
| H01L 29/165 | (2006.01) |

(Continued)

(52) U.S. Cl.
CPC ........ *H01L 29/785* (2013.01); *H01L 21/31111* (2013.01); *H01L 21/764* (2013.01); *H01L 21/823431* (2013.01); *H01L 21/823437* (2013.01); *H01L 27/10879* (2013.01); *H01L 29/1095* (2013.01); *H01L 29/161* (2013.01); *H01L 29/165* (2013.01); *H01L 29/1608* (2013.01); *H01L 29/66795* (2013.01); *H01L 21/02381* (2013.01); *H01L 21/02532* (2013.01); *H01L 21/02636* (2013.01); *H01L 21/3115* (2013.01); *H01L 21/3141* (2013.01); *H01L 21/3185* (2013.01); *H01L 21/31116* (2013.01); *H01L 27/0886* (2013.01)

(58) Field of Classification Search
None
See application file for complete search history.

(56) References Cited

U.S. PATENT DOCUMENTS 6,043,138 A    3/2000  Ibok
6,492,216 B1  12/2002  Yeo et al.

(Continued)

OTHER PUBLICATIONS

Sanchez et al., "Low-Temperature Growth of Epitaxial Beta-SiC on Si(100) Using Supersonic Molecular Beams of Methylsilance," J. Phys. Chem. B., Jul. 2002, pp. 8019-8028.

(Continued)

*Primary Examiner* — Zandra Smith
*Assistant Examiner* — Molly Reida
(74) *Attorney, Agent, or Firm* — J.C. Patents

(57) ABSTRACT

A semiconductor structure for forming FinFETs is described. The semiconductor structure includes a semiconductor substrate, a plurality of odd fins of the FinFETs on the substrate, and a plurality of even fins of the FinFETs on the substrate between the odd fins of the FinFETs. The odd fins of the FinFETs are defined from the substrate. The even fins of the FinFETs are different from the odd fins of the FinFETs in at least one of the width and the material, and may be further different from the odd fins of the FinFETs in the height.

20 Claims, 2 Drawing Sheets

(51) Int. Cl.
  *H01L 21/311* (2006.01)
  *H01L 29/10* (2006.01)
  *H01L 29/16* (2006.01)
  *H01L 29/161* (2006.01)
  *H01L 21/02* (2006.01)
  *H01L 21/3115* (2006.01)
  *H01L 21/314* (2006.01)
  *H01L 21/318* (2006.01)
  *H01L 27/088* (2006.01)

(56) References Cited

U.S. PATENT DOCUMENTS

| | | |
|---|---|---|
| 6,500,725 B1 | 12/2002 | Chen et al. |
| 6,921,963 B2 | 7/2005 | Krivokapic et al. |
| 7,087,477 B2 | 8/2006 | Fried et al. |
| 7,091,551 B1 | 8/2006 | Anderson et al. |
| 7,247,887 B2 | 7/2007 | King et al. |
| 7,250,658 B2 | 7/2007 | Doris et al. |
| 7,309,626 B2 | 12/2007 | Ieong et al. |
| 7,352,034 B2 | 4/2008 | Booth, Jr. et al. |
| 7,470,570 B2 | 12/2008 | Beintner et al. |
| 7,531,437 B2 | 5/2009 | Brask et al. |
| 7,569,857 B2 | 8/2009 | Simon et al. |
| 7,888,192 B2 | 2/2011 | Marshall et al. |
| 2004/0195624 A1 | 10/2004 | Liu et al. |
| 2005/0051825 A1 | 3/2005 | Fujiwara et al. |
| 2006/0099830 A1 | 5/2006 | Walther et al. |
| 2006/0286729 A1 | 12/2006 | Kavalieros et al. |
| 2007/0010049 A1 | 1/2007 | Anderson et al. |
| 2007/0108528 A1 | 5/2007 | Anderson et al. |
| 2007/0158756 A1 | 7/2007 | Dreeskornfeld et al. |
| 2008/0020515 A1* | 1/2008 | White et al. .......... 438/118 |
| 2008/0121970 A1 | 5/2008 | Aritome |
| 2008/0157208 A1 | 7/2008 | Fischer et al. |
| 2009/0124097 A1 | 5/2009 | Cheng |
| 2009/0159936 A1 | 6/2009 | Shah et al. |
| 2009/0242964 A1 | 10/2009 | Akil et al. |
| 2009/0269916 A1 | 10/2009 | Kang et al. |
| 2010/0048027 A1 | 2/2010 | Cheng et al. |
| 2010/0072553 A1 | 3/2010 | Xu et al. |
| 2010/0144121 A1 | 6/2010 | Chang et al. |
| 2010/0167506 A1 | 7/2010 | Lin et al. |
| 2010/0193770 A1 | 8/2010 | Bangsaruntip et al. |
| 2012/0028473 A1 | 2/2012 | Lai et al. |
| 2012/0043597 A1 | 2/2012 | Chen et al. |
| 2014/0054650 A1 | 2/2014 | Colinge |

OTHER PUBLICATIONS

"Archived wikipedia entry of Silicon," Wekipedia, Jul. 2013, pp. 1-9.
"Archived wikipedia entry of Silicon carbide," Wekipedia, Jul. 2013, pp. 1-8.

* cited by examiner

SEMICONDUCTOR STRUCTURE WITH DIFFERENT FINS OF FINFETS

CROSS-REFERENCE TO RELATED APPLICATION

This application is a divisional of and claims the priority benefit of U.S. application Ser. No. 13/370,231 filed on Feb. 9, 2012, now pending. The entirety of the above-mentioned patent application is hereby incorporated by reference herein and made a part of specification.

BACKGROUND OF THE INVENTION

1. Field of Invention

This invention relates to a semiconductor process, and particularly relates to a method for fabricating fin-type field-effect transistors (FinFETs), and a semiconductor structure that is fabricated using the method.

2. Description of Related Art

MOS is a basic structure widely applied to various semiconductor devices, such as memory devices, image sensors and display devices.

The traditional MOS transistor is difficult to scale down due to the limitation of the fabricating process, so double-gate transistors with better properties are developed. One example is the FinFET, which has a 3D gate structure to enhance the control on the channel and inhibit the leakage current caused by the punch-through effect, and thus has a higher gate control capability than the conventional MOS transistor.

However, in the current FinFET process, the density of the fin patterns of the FinFET array is quite high and the thickness of the photoresist layer is quite large, so that the pattern development is difficult and an accurate pattern transfer is impossible.

SUMMARY OF THE INVENTION

Accordingly, this invention provides a method for fabricating FinFETs that is capable of solving the above problems of the prior art.

This invention also provides a semiconductor structure that is fabricated using the method of this invention.

The method for fabricating FinFETs of this invention is described as follows. A semiconductor substrate is patterned to form a plurality of odd fins. A plurality of spacers is formed on the substrate and on the sidewalls of the odd fins, wherein each spacer has a substantially vertical sidewall. A plurality of even fins is then formed on the substrate between the spacers.

In an embodiment, the substantially vertical-sidewall spacers are formed as follows. A substantially conformal material layer is formed over the substrate. An anisotropic treatment partially changing the etching selectivity of the material layer is performed to the material layer. The material layer is then selectively etched. The anisotropic treatment may include an ion-implantation process or a plasma treatment.

The semiconductor structure for forming FinFETs of this invention includes a semiconductor substrate, a plurality of odd fins of the FinFETs on the substrate, and a plurality of even fins of the FinFETs on the substrate between the odd fins of the FinFETs. The odd fins of the FinFETs are defined from the substrate. The even fins of the FinFETs are different from the odd fins of the FinFETs in at least one of the width and the material, and may be further different from the odd fins of the FinFETs in the height.

The semiconductor structure for forming FinFETs of this invention includes a semiconductor substrate, a plurality of odd fins of the FinFETs on the substrate, and a plurality of even fins of the FinFETs on the substrate between the odd fins of the FinFETs. The even fins of the FinFETs are different from the odd fins of the FinFETs in at least one of the width and the material, and may be further different from the odd fins of the FinFETs in the height.

The semiconductor structure for forming FinFETs of this invention includes a semiconductor substrate, a plurality of first fins of the FinFETs on the substrate, and a plurality of second fins of the FinFETs on the substrate. Each of the second fins of the FinFETs is located between two first fins of the FinFETs. The second fins of the FinFETs are different from the first fins of the FinFETs in at least one of the width and the material, and may be further different from the first fins of the FinFETs in the height.

In the method for fabricating FinFETs of this invention, since the odd fins are formed prior to the even fins, the fin pattern density is greatly lowered and the thickness of the photoresist layer can be reduced, so that the development of fin patterns is much easier. Moreover, since the even fins are not formed simultaneously with the odd fins, the width thereof can be controlled by the width of each spacer or the thickness of the substantially conformal layer for forming the spacers, and the height thereof can be controlled by the growth process thereof, the even fins can be different from the odd fins in at least one of the height, the width and the material.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit its scope.

Figure 4:
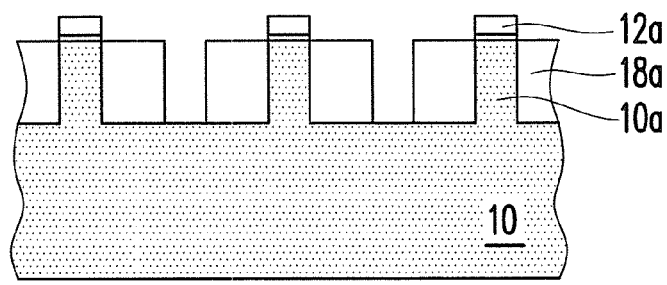
Figure 5:
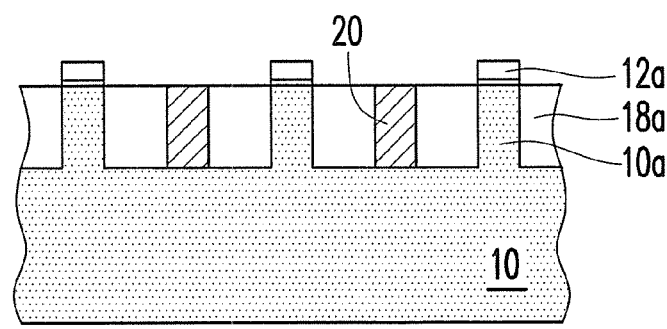
Figure 6:
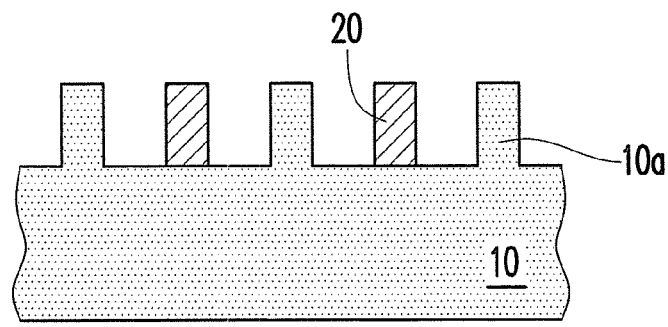

FIGS. 1-6 illustrate, in a cross-sectional view, a method for fabricating FinFETs patterning process according to an embodiment of this invention, wherein FIG. 6 also illustrates a semiconductor structure according to the embodiment.

Figure 1:
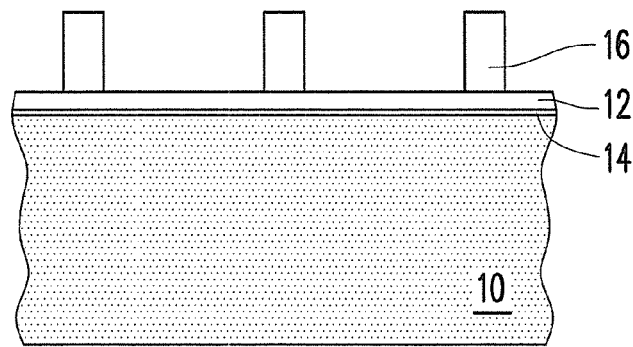
FIGS. 1-6 illustrate, in a cross-sectional view, a method for fabricating FinFETs patterning process according to an embodiment of this invention, wherein FIG. 6 also illustrates a semiconductor structure according to the embodiment.

Referring to FIG. 1, a semiconductor substrate 10 is provided, which may be a lightly doped single-crystal silicon substrate. A hard mask layer 12 is then formed on the substrate 10, possibly including silicon nitride (SiN) or SiON. When the hard mask layer 12 includes SiN, pad oxide 14 may be formed on the substrate 10 in advance. A patterned photoresist layer 16 with the patterns of the odd fins of the FinFETs is then formed on the hard mask layer 12. The photoresist layer 16 may include a positive or negative photoresist material.

Figure 2:
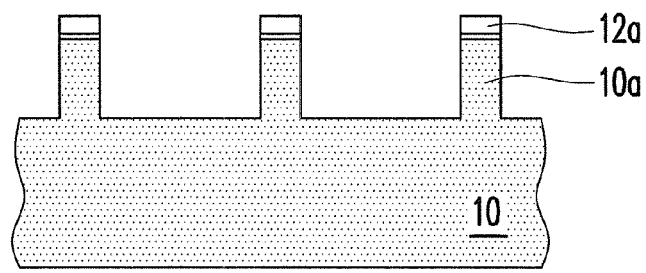

Referring to FIG. 2, after the hard mask layer 12 is patterned using the patterned photoresist layer 16 as a mask, the substrate 10 is successively etched and patterned using the patterned photoresist layer 16 and the pattered hard mask layer 12a as a mask to form a plurality of odd fins 10a. The patterned photoresist layer 16 is usually entirely consumed in the patterning process.

Figure 3:
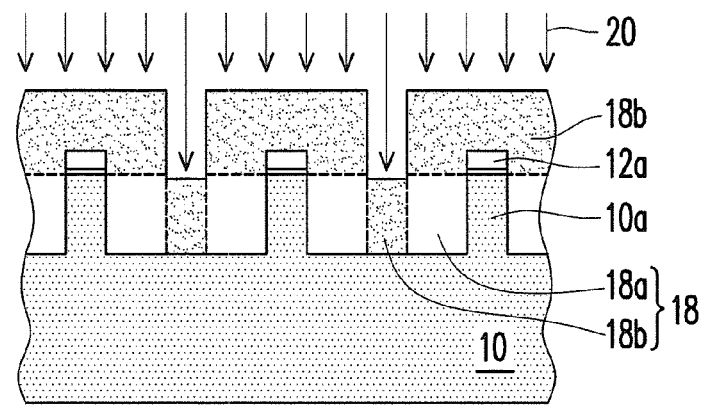

Referring to FIG. 3, a substantially conformal material layer 18 is formed over the substrate 10. The material layer 18 may be formed by an atomic layer deposition (ALD) process or a furnace deposition process, and the material thereof may be SiN. An anisotropic treatment 20 partially changing the etching selectivity of the material layer 18 is then performed to the material layer 18, forming low-selectivity regions 18a on the substrate 10 and on the sidewalls of the odd fins 10a, and high-selectivity regions 18b over the odd fins 10a and under the recesses regions of the material layer 18. The anisotropic treatment 20 is conducted in a manner such that the interface between any pair of a low-selectivity region 18a and an adjacent high-selectivity region 18b under a recesses region of the material layer 18 is substantially vertical. The anisotropic treatment 20 may include an ion-implantation process or a plasma treatment.

Referring to FIG. 4, a selective etching process is performed to remove the high-selectivity regions 18b, leaving the low-selectivity regions 18a as a plurality of spacers on the substrate 10 and on the sidewalls of the odd fins 10a, wherein each of the spacers 18a has a substantially vertical sidewall because the interface between any pair of a low-selectivity region 18a and an adjacent high-selectivity region 18b under a recesses region of the material layer 18 is substantially vertical.

In an embodiment, the material layer 18 includes SiN, the anisotropic treatment 20 includes an ion-implantation process that implants carbon ions in the to-be-removed portions of the material layer 18, and the selective etching for removing the high-selectivity regions 18b of the material layer 18 utilizes phosphoric acid.

Referring to FIG. 5, a plurality of even fins 20 is then formed on the substrate 10 between the spacers 18a, possibly by an epitaxy process as a selective deposition process based on the exposed surfaces of the semiconductor substrate 10. When the semiconductor substrate 10 includes Si, the product material of the epitaxy process may be Si, SiGe or SiC.

Since the even fins 20 are not formed simultaneously with the odd fins 10a, the material thereof can be different from that of the odd fins 10a. For example, it is possible that the odd fins 10a include Si and the even fins 20 comprise SiC or SiGe. Nevertheless, the even fins 20 may alternatively be formed from the same material (e.g., Si) of the odd fins 10a, which is namely the material of the substrate 10, by epitaxy.

In addition, the width of each even fin 20 can be controlled by the width of each spacer 18a (see FIG. 4), which is in turn controlled by the deposition thickness of the substantially conformal material layer 18 for forming the spacers 18a (see FIG. 3). The height of the even fins 20 can be controlled by the growth process of the even fins 20. Accordingly, the even fins 20 may be different from the odd fins 10a in at least one of the height, the width and the material.

Referring to FIG. 6, the pattered hard mask layer 12a and the spacers 18a are removed, leaving the odd fins 10a and even fins 20 that are arranged alternately.

FIG. 6 also illustrates a semiconductor structure according to the embodiment of this invention. The semiconductor structure includes odd fins 10a and even fins 20 that are arranged alternately. The odd fins 10a are defined from the semiconductor substrate 10. The even fins 20 may be different from the odd fins 10a in at least one of the width and the material, and may be further different from the odd fins 10a also in height, as mentioned above.

In the above embodiment of this invention, since the odd fins are formed prior to the even fins, their pattern density is greatly reduced and the thickness of the photoresist layer can be reduced, so that the development of fin patterns is much easier.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor structure for forming FinFETs, comprising
a semiconductor substrate, wherein a top portion of the semiconductor substrate comprises a semiconductor material;
a plurality of odd fins of the FinFETs on the semiconductor substrate, being defined from the semiconductor substrate and being formed of the semiconductor material; and
a plurality of even fins of the FinFETs on the semiconductor substrate between the odd fins of the FinFETs, being different from the odd fins of the FinFETs in at least one of width and material, wherein the plurality of even fins are in direct contact with the semiconductor material.

2. The semiconductor structure of claim 1, wherein the even fins of the FinFETs are further different from the odd fins of the FinFETs in height.

3. The semiconductor structure of claim 1, wherein the even fins of the FinFETs comprise an epitaxy material.

4. The semiconductor structure of claim 3, wherein the odd fins of the FinFETs comprise Si and the even fins of the FinFETs comprise SiC or SiGe.

5. The semiconductor structure of claim 1, wherein the odd fins of the FinFETs comprise Si.

6. The semiconductor structure of claim 1, wherein the even fins of the FinFETs comprise SiC or SiGe.

7. The semiconductor structure of claim 1, wherein the odd fins of the FinFETs are electrically connected to the semiconductor substrate.

8. The semiconductor structure of claim 1, wherein the semiconductor substrate is a single layer structure.

9. A semiconductor structure for forming FinFETs, comprising
a semiconductor substrate, wherein a top portion of the semiconductor substrate comprises a semiconductor material;
a plurality of odd fins of the FinFETs on the semiconductor substrate and being formed of the semiconductor material, wherein the plurality of odd fins and the semiconductor substrate are in direct contact with each other; and
a plurality of even fins of the FinFETs on the semiconductor substrate between the odd fins of the FinFETs, being different from the odd fins of the FinFETs in at least one of width and material, wherein the plurality of even fins are in direct contact with the semiconductor material.

10. The semiconductor structure of claim 9, wherein the even fins of the FinFETs are further different from the odd fins of the FinFETs in height.

11. The semiconductor structure of claim 9, wherein the even fins of the FinFETs comprise an epitaxy material.

12. The semiconductor structure of claim 11, wherein the odd fins of the FinFETs comprise Si and the even fins of the FinFETs comprise SiC or SiGe.

13. The semiconductor structure of claim 9, wherein the odd fins of the FinFETs comprise Si.

14. The semiconductor structure of claim 9, wherein the even fins of the FinFETs comprise SiC or SiGe.

15. A semiconductor structure for forming FinFET, comprising
- a semiconductor substrate, wherein a top portion of the semiconductor substrate comprises a semiconductor material:
- a plurality of first fins of the FinFETs on the semiconductor substrate and being formed of the semiconductor material, wherein the plurality of first fins and the semiconductor substrate are in direct contact with each other; and
- a plurality of second fins of the FinFETs on the semiconductor substrate, each of the second fins of the FinFETs is located between two first fins of the FinFETs, and the second fins of the FinFETs are different from the first fins of the FinFETs in at least one of width and material, wherein the plurality of second fins are in direct contact with the semiconductor material.

16. The semiconductor structure of claim 15, wherein the second fins of the FinFETs are further different from the first fins of the FinFETs in height.

17. The semiconductor structure of claim 15, wherein the second fins of the FinFETs comprise an epitaxy material.

18. The semiconductor structure of claim 17, wherein the first fins of the FinFETs comprise Si and the second fins of the FinFETs comprise SiC or SiGe.

19. The semiconductor structure of claim 15, wherein the first fins of the FinFETs comprise Si.

20. The semiconductor structure of claim 15, wherein the second fins of the FinFETs comprise SiC or SiGe.

* * * * *